(12) United States Patent
Park (10) Patent No.: US 11,915,738 B2
(45) Date of Patent: Feb. 27, 2024

(54) MEMORY WITH CAPABILITY TO DETECT ROWS THAT ARE PRONE TO DATA LOSS, MEMORY SYSTEM AND OPERATION METHOD OF MEMORY

(71) Applicant: SK hynix Inc., Gyeonggi-do (KR)

(72) Inventor: Min Su Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 18/172,340

(22) Filed: Feb. 22, 2023

(65) Prior Publication Data
US 2023/0197136 A1    Jun. 22, 2023

Related U.S. Application Data

(62) Division of application No. 16/997,457, filed on Aug. 19, 2020, now Pat. No. 11,621,028.

(30) Foreign Application Priority Data

Mar. 11, 2020  (KR) .................. 10-2020-0029977

(51) Int. Cl.
| | | |
|---|---|---|
| *G11C 11/406* | (2006.01) | |
| *G11C 29/44* | (2006.01) | |
| *G11C 11/408* | (2006.01) | |
| *G11C 11/4076* | (2006.01) | |
| *G11C 11/4091* | (2006.01) | |

(52) U.S. Cl.
CPC .... *G11C 11/40615* (2013.01); *G11C 11/4076* (2013.01); *G11C 11/4085* (2013.01); *G11C 11/4091* (2013.01); *G11C 11/40618* (2013.01); *G11C 29/44* (2013.01)

(58) Field of Classification Search
CPC ........ G11C 11/40615; G11C 11/40618; G11C 11/4076; G11C 11/4085; G11C 11/4091; G11C 29/44

See application file for complete search history.

(56) References Cited

U.S. PATENT DOCUMENTS

| | | | |
|---|---|---|---|
| 9,824,742 B1 | 11/2017 | Saifuddin et al. | |
| 10,490,250 B1 * | 11/2019 | Ito ......................... | G11C 29/76 |
| 2004/0233756 A1 | 11/2004 | Choi | |
| 2015/0006836 A1 | 1/2015 | Terada et al. | |
| 2017/0213586 A1 | 7/2017 | Kang et al. | |

(Continued)

FOREIGN PATENT DOCUMENTS

KR    10-2017-0044937 A    4/2017

OTHER PUBLICATIONS

Office Action for the U.S. Appl. No. 16/997,457 issued by the USPTO dated Aug. 9, 2021.

(Continued)

*Primary Examiner* — Sultana Begum
(74) *Attorney, Agent, or Firm* — IP & T GROUP LLP (57) ABSTRACT

A memory may include multiple rows each coupled to multiple memory cells; a target row classification circuit suitable for classifying, as a target row, a row, among the multiple rows, that is susceptible to data loss as a result of activity of an adjacent row; and a target row signal generation circuit suitable for sequentially activating a target row active signal for activating the target row and a target row precharge signal for precharging the target row in response to a precharge command.

9 Claims, 5 Drawing Sheets

(56) References Cited

U.S. PATENT DOCUMENTS

2019/0348107 A1 11/2019 Shin et al.
2022/0189532 A1* 6/2022 Nale .................. G06F 3/0619

OTHER PUBLICATIONS

Office Action for the U.S. Appl. No. 16/997,457 issued by the USPTO dated Jun. 29, 2021.
Office Action for the U.S. Appl. No. 16/997,457 issued by the USPTO dated Dec. 9, 2021.
Office Action for the U.S. Appl. No. 16/997,457 issued by the USPTO dated Feb. 18, 2022.
Office Action for the U.S. Appl. No. 16/997,457 issued by the USPTO dated Mar. 21, 2022.
Office Action for the U.S. Appl. No. 16/997,457 issued by the USPTO dated Aug. 26, 2022.
Notice of Allowance for the U.S. Appl. No. 16/997,457 issued by the USPTO dated Dec. 5, 2022.

* cited by examiner

MEMORY WITH CAPABILITY TO DETECT ROWS THAT ARE PRONE TO DATA LOSS, MEMORY SYSTEM AND OPERATION METHOD OF MEMORY

CROSS-REFERENCE TO RELATED APPLICATION

This application is a division of U.S. patent application Ser. No. 16/997,457 filed on Aug. 19, 2020, which claims priority under 35 U.S.C. § 119 to Korean Patent Application No. 10-2020-0029977, filed on Mar. 11, 2020, which is incorporated herein by reference in its entirety.

BACKGROUND

1. Field

Various embodiments relate to a memory and a memory system.

2. Discussion of the Related Art

As the degree of integration of a memory increases, space between multiple word lines in the memory is reduced. As the space between word lines is reduced, a coupling effect between adjacent word lines increases.

The state of a word line toggles between an active state and an inactive state whenever data is input to, and output from, a memory cell. As the coupling effect between adjacent word lines increases as described above, there occurs a phenomenon in which data of a memory cell coupled to a word line adjacent to a frequently activated word line is damaged. Such a phenomenon is called row hammering, which is problematic because data of a memory cell of an affected word line may be damaged due to word line disturbance before the memory cell is refreshed.

Figure 1:
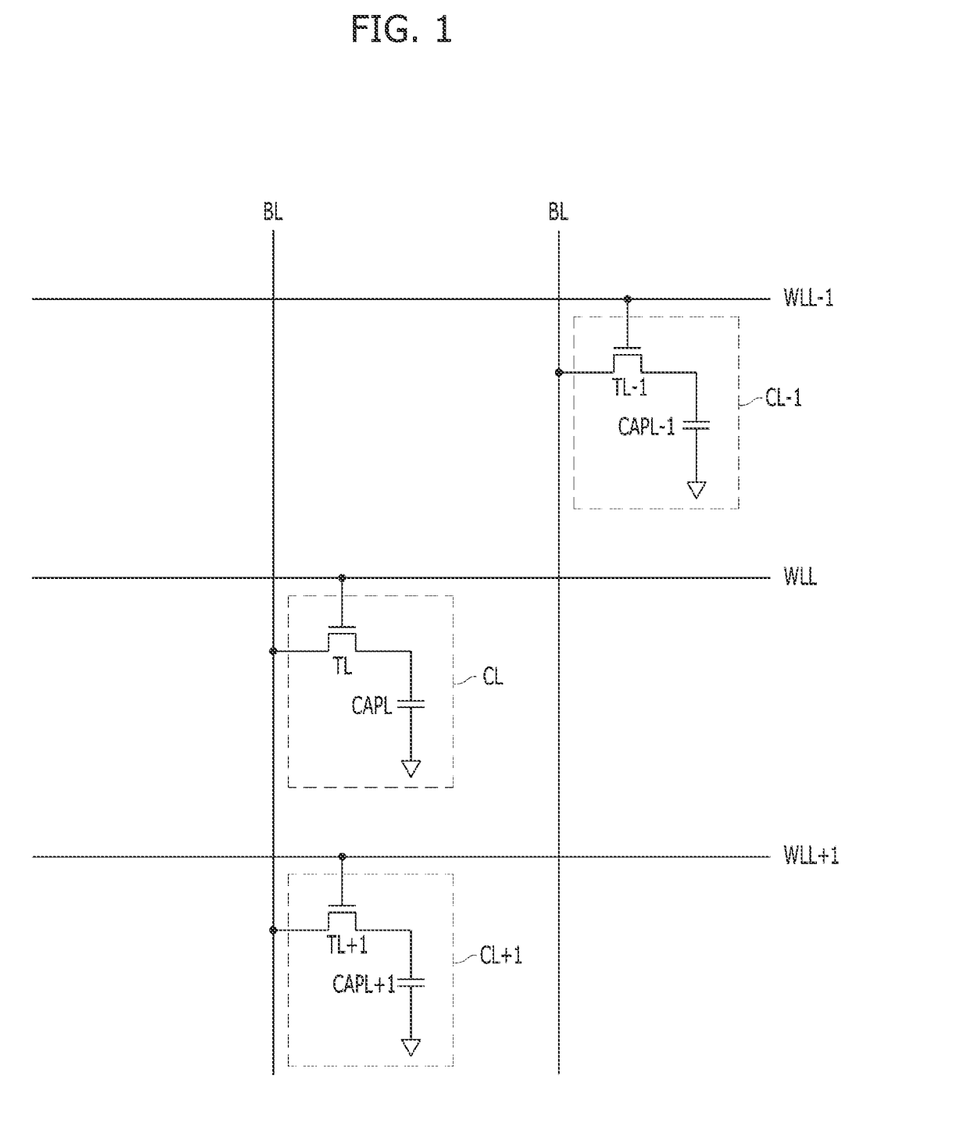
FIG. 1 is a diagram for describing a row hammering phenomenon in a cell array of a memory device.

FIG. 1 is a diagram for describing a row hammering phenomenon in a cell array of a memory device.

In FIG. 1, WLL indicates a word line that has been activated/deactivated many times and thus has a high active count. WLL−1 and WLL+1 indicate word lines disposed adjacent to the word line WLL, that is, the word line having a high active count. Furthermore, CL indicates a memory cell coupled to the word line WLL. CL−1 indicates a memory cell coupled to the word line WLL−1. CL+1 indicates a memory cell coupled to the word line WLL+1. The memory cells include cell transistors TL, TL−1 and TL+1 and cell capacitors CAPL, CAPL−1, and CAPL+1, respectively.

In FIG. 1, when the word line WLL is activated or deactivated, voltages of the word lines WLL−1 and WLL+1 rise or drop due to a coupling phenomenon occurring between the word lines WLL and WLL−1 and between the word lines WLL and WLL+1, affecting the amount of charges in the memory cells CL−1 and CL+1. Accordingly, when the word line WLL is frequently activated so that the state of the word line WLL toggles between the active state and the inactive state, a change in the amount of charges stored in the cell capacitors CAPL−1 and CAPL+1 of the memory cells CL−1 and the CL+1, respectively, is increased. Accordingly, data of the memory cells CL−1 and the CL+1 may deteriorate.

Furthermore, electromagnetic waves occurring as the state of a word line toggles between the active and inactive states introduce electrons into the cell capacitor of a memory cell coupled to an adjacent word line or drain electrons from the cell capacitor of the memory cell coupled to the adjacent word line, damaging data of the memory cell.

A method of finding a row (i.e., word line) that has been activated several times and additionally refreshing rows adjacent to the row that has been activated several times is chiefly used as a method for solving row hammering. In general, the additional refresh operation is performed in a hidden way when a normal refresh operation is performed. For example, whenever N refresh commands (where N is an integer greater than or equal to 1) are applied to a memory, the memory may perform an additional refresh operation in a hidden way, in addition to a normal refresh operation, in a way unknown to a memory controller.

Research on a cryogenic memory operating at a cryogenic temperature has been recently carried out. A refresh operation is very rarely performed (or may not be performed at all) because the leakage of charges from the cell capacitor of a memory rarely occurs at a cryogenic temperature. That is, since the data retention time of a memory cell is greatly increased at a cryogenic temperature, a refresh command is very rarely applied to a memory at cryogenic temperature compared to a memory at normal temperature. However, the influence of data loss attributable to row hammering occurs even in a cryogenic memory. Accordingly, if the refresh command is rarely applied to the memory, the number of additional refresh operations performed by the memory is inevitably reduced.

SUMMARY

Various embodiments are directed to a memory, a memory system and an operation method of the memory for refreshing rows that need to be refreshed due to row hammering.

In an embodiment, a memory may include multiple rows each coupled to multiple memory cells; a target row classification circuit suitable for classifying, as a target row, a row, among the multiple rows, that is susceptible to data loss as a result of activity of an adjacent row; and a target row signal generation circuit suitable for sequentially activating a target row active signal for activating the target row and a target row precharge signal for precharging the target row in response to a precharge command.

In an embodiment, an operating method of a memory may include classifying, as a target row, a row among multiple rows, that is susceptible to data loss as a result of activity of an adjacent row; receiving a precharge command; performing a precharge operation in response to the precharge command; and refreshing the target row in response to the precharge command.

In an embodiment, a memory system may include a memory comprising multiple rows each coupled to multiple memory cells, a target row classification circuit suitable for classifying, as a target row, a row, among the multiple rows, that is susceptible to data loss as a result of activity of an adjacent row, and a target row signal generation circuit suitable for sequentially activating a target row active signal for activating the target row and a target row precharge signal for precharging the target row in response to a precharge command; and a memory controller suitable for applying the precharge command to the memory.

In an embodiment, an operating method of a memory system may include identifying a row among a plurality of rows coupled to a plurality of cells, the selected row having been accessed more than or equal to a threshold number of times; sequentially activating an active signal and a precharge signal for each target row adjacent to the identified row, in response to a precharge command; and providing the active signal and the precharge signal to each target row such that an active operation and a precharge operation on each target row are sequentially performed.

DETAILED DESCRIPTION

Various embodiments are described below in more detail with reference to the accompanying drawings. The present invention may, however, be embodied in different forms and ways. Thus, the present invention is not limited to the embodiments set forth herein. Rather, these embodiments are provided so that this disclosure is thorough and complete, and fully conveys the scope of the present disclosure to those skilled in the art. Throughout the disclosure, like reference numerals refer to like parts throughout the various figures and embodiments of the present disclosure. Also, throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 2:
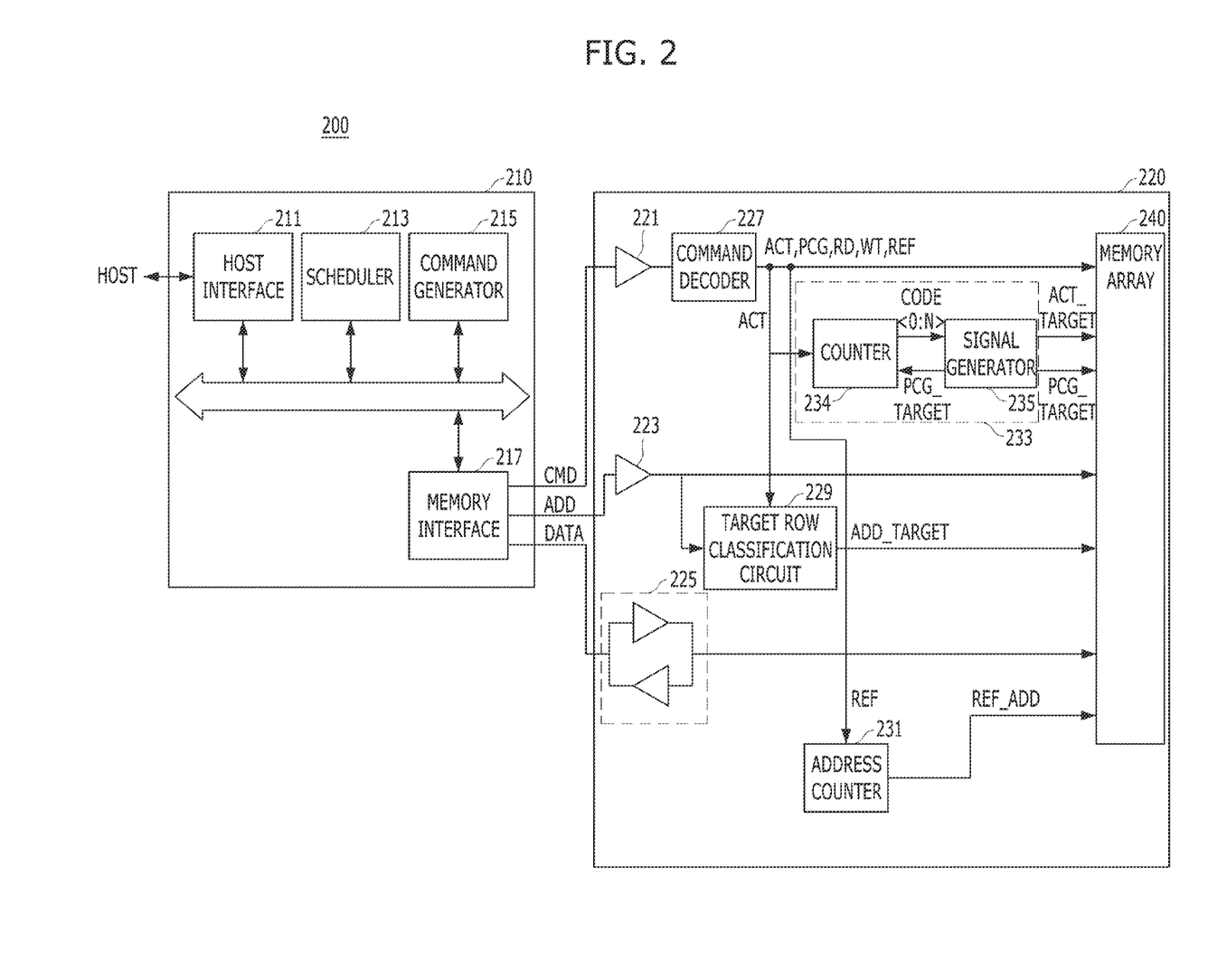
FIG. 2 illustrates a configuration of a memory system according to an embodiment.

FIG. 2 illustrates a configuration of a memory system 200 according to an embodiment.

Referring to FIG. 2, the memory system 200 may include a memory controller 210 and a memory 220.

The memory controller 210 may control an operation of the memory 220 in response to a request from a host (HOST). The host may include a central processing unit (CPU), a graphics processing unit (GPU), and an application processor (AP). The memory controller 210 may include a host interface 211, a scheduler 213, a command generator 215 and a memory interface 217. The memory controller 210 may be included in the CPU, the GPU, and/or the AP, any of which may be distributed in terms of elements and functionality. In this case, the host may include elements of the CPU, GPU, and/or AP other than the memory controller 210. For example, if the memory controller 210 is included in the CPU, the host may include the remaining elements of the CPU other than the memory controller 210.

The host interface 211 may be an interface for communication between the host and the memory controller 210.

The scheduler 213 may determine the sequence of requests from the host and that will be made to the memory 220. The scheduler 213 may differently determine the sequence of requests received from the host and the sequence of operations to be performed by the memory 220 for improvement in performance of the memory 220. For example, although the host first requested a read operation on the memory 220 and then requested a write operation on the memory 220, the scheduler 213 may adjust the sequence of the read operation and the write operation so that the write operation is performed prior to the read operation.

The scheduler 213 may schedule a refresh operation between operations, requested by the host, in order to prevent data of the memory 220 from being lost. If the memory system 200 operates in a cryogenic environment, the data retention time of the memory 220 rapidly increases. Accordingly, the scheduler 213 may very rarely schedule a refresh operation in a cryogenic environment. For example, the scheduler 213 may schedule a refresh operation so that the memory cells of the memory 220 may be refreshed once a day. If information indicating that the number of rows classified as rows likely to lose due to row hammering (target rows) is greater than or equal to a threshold is received from the memory 220, the scheduler 213 may schedule an additional refresh operation to decrease the likelihood of that occurrence.

The command generator 215 may generate a command to be applied to the memory 220, based on the sequence of operations determined by the scheduler 213.

The memory interface 217 may be an interface between the memory controller 210 and the memory device 220. Through the memory interface 217, a command CMD and an address ADD may be transmitted from the memory controller 210 to the memory 220, and data (DATA) may be exchanged between the memory controller 210 and the memory 220. The memory interface 217 is called a PHY interface.

The memory 220 may perform an operation indicated by the memory controller 210. The memory 220 may include a command reception circuit 221, an address reception circuit 223, a data transmission/reception circuit 225, a command decoder 227, a target row classification circuit 229, an address counter 231, a target row signal generation circuit 233 and a memory array 240.

The command reception circuit 221 may receive the command CMD from the memory interface 217 of the memory controller 210. The address reception circuit 223 may receive the address ADD from the memory interface 217 of the memory controller 210. The data transmission/reception circuit 225 may receive data, associated with a write operation, from the memory interface 217. Further, the data transmission/reception circuit 225 may transmit data, associated with a read operation, to the memory interface 217. The memory 220 is equipped with multiple command pads (not illustrated), multiple address pads (not illustrated) and multiple data pads (not illustrated). The command reception circuit 221 may receive the command CMD through the multiple command pads. The address reception circuit 223 may receive the address ADD through the multiple address pads. The data transmission/reception circuit 225 may exchange data through the multiple data pads.

The command decoder 227 may generate internal command signals ACT, PCG, RD, WT, and REF by decoding the command CMD received through the command reception circuit 221. The internal command signals may include an active signal ACT, a precharge signal PCG, a read signal RD, a write signal WT, and a refresh signal REF.

The target row classification circuit 229 may classify, as a target row, a row of the memory array 240 that is in danger of, e.g., susceptible to, data loss (i.e., word line) as a result of activity of an adjacent row or word line. The target row classification circuit 229 may select, as a target row, a row adjacent to a row that has been activated several times, based on the active signal ACT and the address ADD received through the address reception circuit 223. For example, when a fourth row is activated (or accessed) several times, the target row classification circuit 229 may select, as target rows, a third row and a fifth row adjacent to the fourth row. A target address ADD_TARGET output by the target row classification circuit 229 may be an address indicative of a target row.

The address counter 231 may change a refresh address REF_ADD whenever the refresh signal REF is activated. The refresh address REF_ADD may be used for a normal refresh operation, not an additional refresh operation.

The target row signal generation circuit 233 may sequentially activate a target row active signal ACT_TARGET and a target row precharge signal PCG_TARGET in response to the precharge signal PCG, that is, a precharge command applied by the memory controller 210. Specifically, when a condition is satisfied, the target row signal generation circuit 233 may sequentially activate the target row active signal ACT_TARGET and the target row precharge signal PCG_TARGET in response to the precharge signal. The target row signal generation circuit 233 may include a counter 234 and a signal generator 235.

The counter 234 may generate a code CODE<0:N> by counting the number of active signals ACT. When the target row precharge signal PCG_TARGET is activated, the counter 234 may reset a value of the code CODE<0:N> to 0 in response to the activation of the target row precharge signal PCG_TARGET.

If a value of the code CODE<0:N> is greater than or equal to a threshold (e.g., 1000), the signal generator 235 may activate the target row active signal ACT_TARGET after a first delay time from the time at which the precharge signal PCG is activated when the precharge signal PCG is activated, and may activate the target row precharge signal PCG_TARGET after a second delay time from the time at which the target row active signal ACT_TARGET is activated. In this case, the first delay time may be greater than or equal to time that is necessary for a precharge operation based on the precharge signal PCG to be performed in the memory array 240. The second delay time may be greater than or equal to time that is necessary for a target row active operation based on the target row active signal ACT_TARGET to be performed in the memory array 240. If a value of the code CODE<0:N> is less than the threshold, although the precharge signal PCG is activated, the signal generator 235 may not activate the target row active signal ACT_TARGET and the target row precharge signal PCG_TARGET.

The memory array 240 may perform operations indicated by the internal command signals ACT, PCG, RD, WT, and REF generated by the command decoder 227 and the signals ACT_TARGET and PCG_TARGET generated by the target row signal generation circuit 233. When the target row active signal ACT_TARGET is activated, the memory array 240 may activate a row (i.e., target row) selected by the target address ADD_TARGET. When the target row precharge signal PCG_TARGET is activated, the memory array 240 may precharge a target row. In a refresh operation in which the refresh signal REF is activated, the memory array 240 may perform a refresh operation on a row selected by the refresh address REF_ADD. When the memory array 240 performs active, read and write operations, the address ADD received from the memory controller 210 may be used. The memory array 240 may include elements for active, precharge, read, write, refresh and additional refresh operations, such as a cell array, a row circuit for activating/deactivating a row of the cell array, and a column circuit for inputting/outputting data to/from the cell array.

Figure 3:
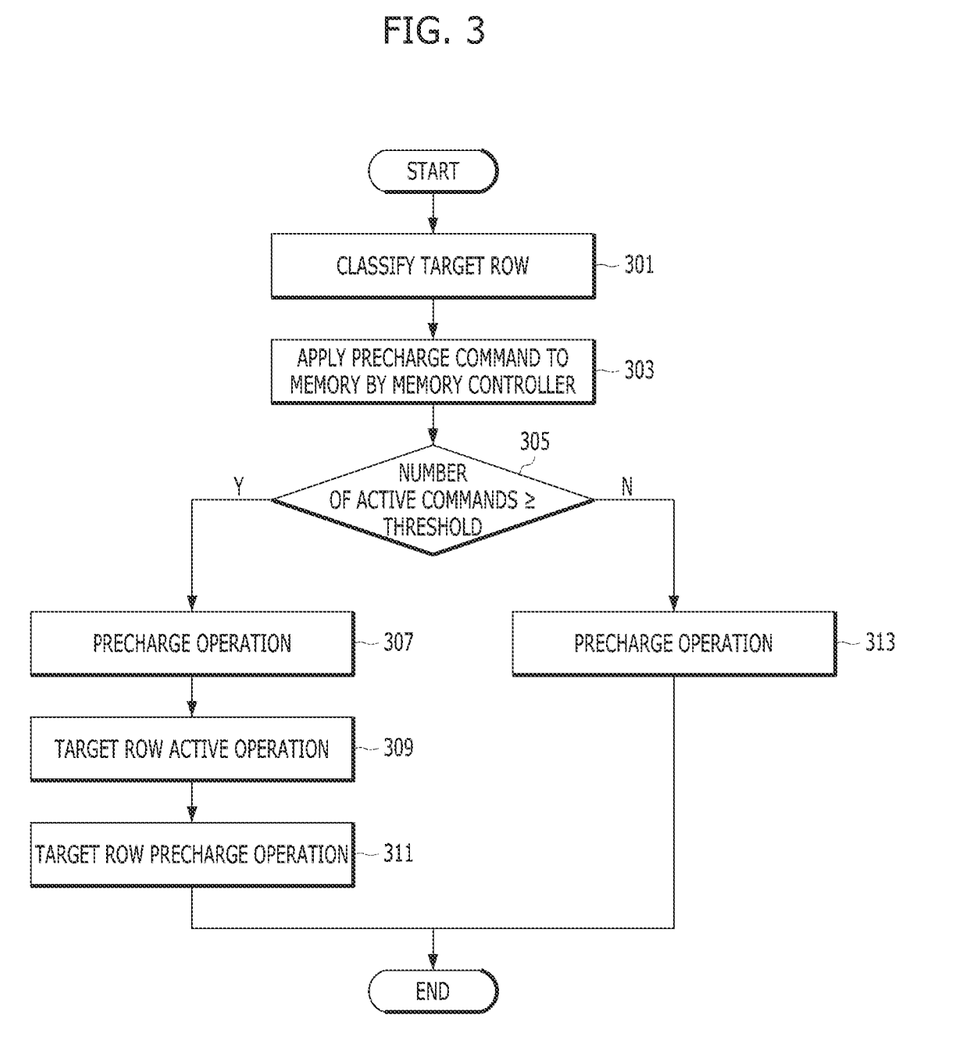
FIG. 3 is a diagram illustrating an embodiment of an operating method of a memory system, such as that in FIG. 2.

FIG. 3 is a diagram illustrating an embodiment of an operating method of the memory system 200 in FIG. 2.

Referring to FIG. 3, the target row classification circuit 229 of the memory 220 may classify, as a target row, one or more rows in danger of data loss (301). Such classification is based on access of the adjacent row(s). For example, the target row classification circuit 229 may classify, as target rows, rows adjacent to an excessively accessed row.

A precharge command may be applied to the memory 220 by the memory controller 210 (303). The command decoder 227 of the memory 220 may activate the precharge signal PCG.

When the number of times the precharge signal PCG is activated (number of active operations) is greater than or equal to a threshold (Y in 305), the signal generator 235 of the memory 220 may sequentially activate the target row active signal ACT_TARGET and the target row precharge signal PCG_TARGET in response to the activation of the precharge signal PCG. Accordingly, a precharge operation 307, a target row active operation 309 and a target row precharge operation 311 may be sequentially performed on the memory 220.

When the number of active operations is less than the threshold (N in 305), the signal generator 235 of the memory 220 may not activate the target row active signal ACT_TARGET and the target row precharge signal PCG_TARGET although the precharge signal PCG is activated. Accordingly, the memory 220 may perform only a precharge operation 313.

According to the operating method of FIG. 3, when a condition is satisfied, e.g., that specified in 305, the memory 220 may perform an operation of activating a target row and then precharging the target row, that is, an operation of refreshing the target row, in response to a precharge command. Accordingly, even in a memory system such as a cryogenic memory system in which a refresh operation is rarely performed, target rows that need to be refreshed due to row hammering may be refreshed.

When the memory controller 210 applies a precharge command to the memory 220, the memory 220 may sequentially perform a precharge operation, a target row active operation and a target row precharge operation. Accordingly, the memory controller 210 may apply a subsequent command to the memory 220 after waiting for the time taken for such operations to be performed.

Figure 4:
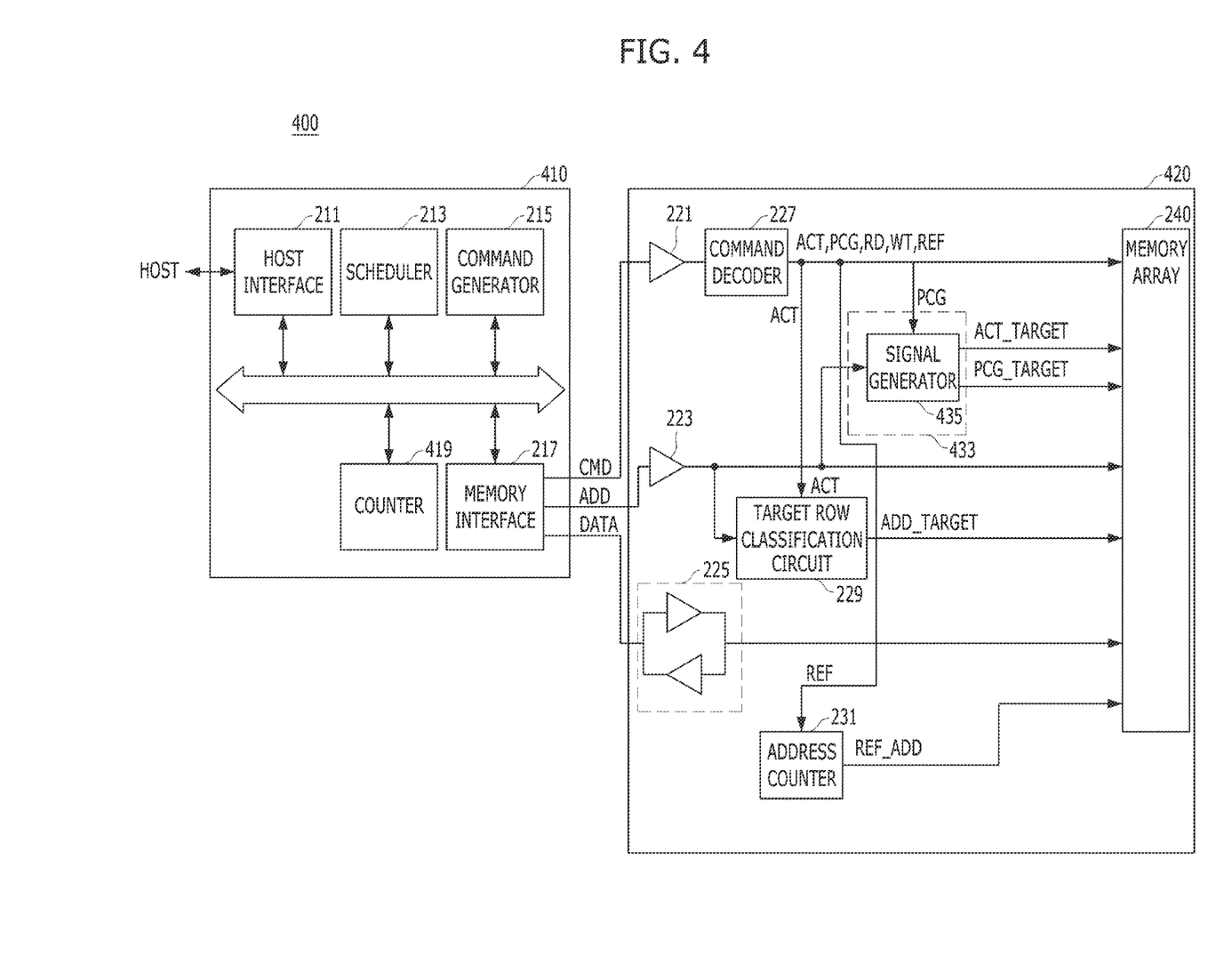
FIG. 4 illustrates a configuration of a memory system according to another embodiment.

FIG. 4 illustrates a configuration of a memory system 400 according to another embodiment.

Referring to FIG. 4, the memory system 400 may include a memory controller 410 and a memory 420.

The memory controller 410 may control an operation of the memory 420 in response to a request from a host (HOST). The host may include a central processing unit (CPU), a graphics processing unit (GPU), and an application processor (AP). The memory controller 410 may include a host interface 211, a scheduler 213, a command generator 215, a memory interface 217 and a counter 419. The memory controller 410 may be included in the CPU, the GPU, and/or the AP, any of which may be distributed in terms of elements and functionality. In this case, the host may include elements of the CPU, GPU, and/or AP other than the memory controller 410. For example, if the memory controller 410 is included in the CPU, the host may include the remaining elements of the CPU other than the memory controller 410.

The memory controller 410 may further include the counter 419, unlike the memory controller 210 of FIG. 2. The counter 419 may count the number of active commands applied to the memory 420 by the memory controller 410. If a precharge command is applied to the memory 420 through the memory interface 217 of the memory controller 410, when the number of active commands counted by the counter 419 is greater than or equal to a threshold (e.g., 1000), the memory interface 217 may activate a flag signal and transmit the activated flag signal to the memory 420. A count result of the counter 419 may be reset when the flag signal is activated. In this case, the flag signal may be a specific bit signal of multi-bit signals in an address ADD. If a precharge command is applied to the memory 420 by the memory controller 410, most of addresses ADD are not used. Accordingly, there may be no issue in using, as a flag signal, some bits of an address ADD not used when a precharge command is applied.

The memory 420 may perform an operation indicated by the memory controller 410. The memory 420 may include a command reception circuit 221, an address reception circuit 223, a data transmission/reception circuit 225, a command decoder 227, a target row classification circuit 229, an address counter 231, a target row signal generation circuit 433 and a memory array 240.

In the memory 420, the target row signal generation circuit 433 may be differently designed, compared to the memory 220. The target row signal generation circuit 433 may include a signal generator 435. The signal generator 435 may receive a precharge signal PCG and a flag signal (e.g., a specific bit of the address ADD). When both the precharge signal PCG and the flag signal are activated, the signal generator 435 may activate a target row active signal ACT_TARGET after a first delay time from the time at which the precharge signal PCG is activated, and may activate a target row precharge signal PCG_TARGET after a second delay time from the time at which the target row active signal ACT_TARGET is activated. When the precharge signal PCG is activated, if the state of a flag signal (e.g., a specific bit of the address ADD) is an inactive state, the signal generator 435 may not activate the target row active signal ACT_TARGET and the target row precharge signal PCG_TARGET.

Figure 5:
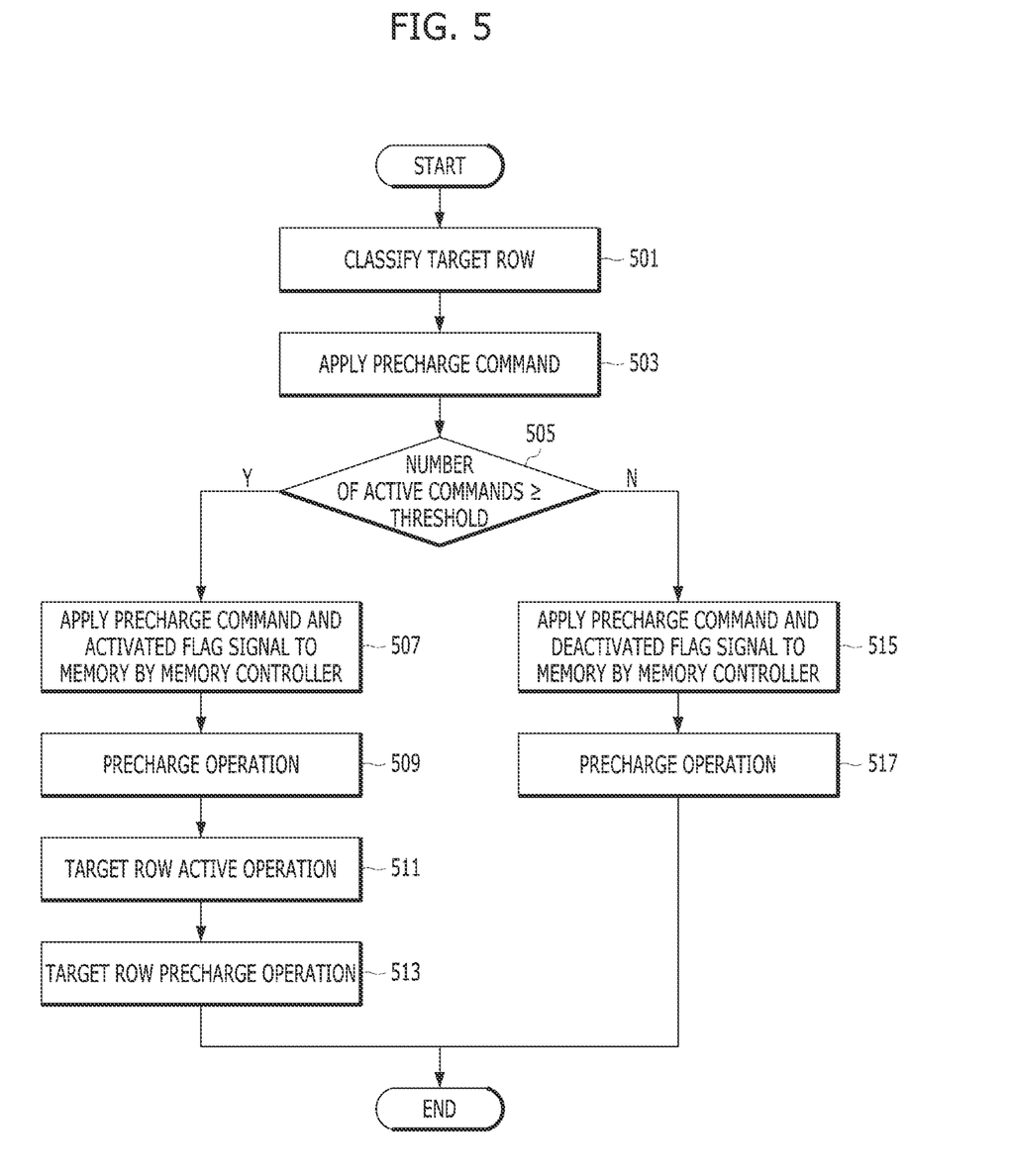
FIG. 5 is a diagram illustrating an embodiment of an operating method of a memory system, such as that in FIG. 4.

FIG. 5 is a diagram illustrating an embodiment of an operating method of the memory system 400 in FIG. 4.

Referring to FIG. 5, the target row classification circuit 229 of the memory 420 may classify, as a target row, one or more rows having in danger of data loss (501). Such classification is based on access of the adjacent row(s). For example, the target row classification circuit 229 may classify, as target rows, rows adjacent to an excessively accessed row.

The memory controller 410 may determine to apply a precharge command to the memory 420 (503). Specifically, the scheduler 213 of the memory controller 410 may schedule that the memory controller 410 will apply the precharge command to the memory 420.

When the number of active commands applied to the memory 420 by the memory controller 410 is greater than or equal to a threshold (Y in 505), the memory controller 410 may transmit, to the memory 420, an activated flag signal together with the precharge command (507). The command decoder 227 of the memory 420 may activate the precharge signal PCG.

The signal generator 435 of the memory 420 may sequentially activate the target row active signal ACT_TARGET and the target row precharge signal PCG_TARGET in response to the activated precharge signal PCG and the activated flag signal (e.g., a specific bit of the address ADD). Accordingly, the memory 420 may sequentially perform a precharge operation 509, a target row active operation 511 and a target row precharge operation 513.

When the number of active commands applied to the memory 420 by the memory controller 410 is less than the threshold (N in 505), the memory controller 410 may transmit, to the memory 420, a deactivated flag signal together with a precharge command (515). The command decoder 227 of the memory 420 may activate the precharge signal PCG.

Since the flag signal (e.g., a specific bit of the address ADD) has been deactivated, the signal generator 435 of the memory 420 may not activate the target row active signal ACT_TARGET and the target row precharge signal PCG_TARGET although the precharge signal PCG is activated. Accordingly, the memory 420 may perform only a precharge operation 517.

According to the operating method of FIG. 4, when a condition is satisfied, e.g., that specified in 505, the memory controller 410 activates a flag signal and transmits, to the memory 420, the activated flag signal together with a precharge command. In this case, the memory 420 may perform an operation of refreshing a target row along with a precharge operation. Accordingly, even in a memory system such as a cryogenic memory system in which a refresh operation is rarely performed, target rows that need to be refreshed due to row hammering may be refreshed.

If the memory controller 410 activates a flag signal and transmits the activated flag signal to the memory 420 along with a precharge command, the memory 420 may sequentially perform a precharge operation, a target row active operation and a target row precharge operation. Accordingly, the memory controller 410 may apply a subsequent command to the memory 420 after waiting for the time taken for such operations to be performed.

If the memory controller 410 deactivates a flag signal and transmits, to the memory 420, the deactivated flag signal together with a precharge command, the memory 420 may perform only a precharge operation. Accordingly, the memory controller 410 may apply a subsequent command to the memory 420 after waiting for only the time taken for the precharge operation to be performed.

According to embodiments of the present disclosure, it is possible to refresh rows that need to be refreshed due to row hammering.

Although various embodiments have been illustrated and described, it will be apparent to those skilled in the art that various changes and modifications may be made without departing from the spirit and scope of the invention as defined in the following claims. The present invention encompasses all such changes and modifications to the extent they fall within the scope of the claims.

What is claimed is:

1. An operating method of a memory, the operating method comprising:
   classifying, as a target row, a row among multiple rows, that is susceptible to data loss as a result of activity of an adjacent row;
   receiving a precharge command;
   performing a precharge operation in response to the precharge command; and
   refreshing the target row in response to the precharge command,
   wherein the refreshing of the target row comprises:
   counting the number of active commands applied;
   checking that a result of the counting is greater than or equal to a threshold, in response to the precharge command;
   activating a target row active signal for activating the target row; and activating a target row precharge signal for precharging the target row, wherein the target row active signal is activated after a first delay time from a time at which the precharge command is applied.

2. The operating method of claim 1, wherein the refreshing of the target row comprises:

counting the number of active commands applied; and checking that the result of the counting is less than the threshold, in response to the precharge command and terminating the refreshing of the target row.

3. The operating method of claim 1, wherein the refreshing of the target row comprises:

checking whether a flag signal has been activated;

activating the target row in response to the activation of the flag signal; and precharging the activated target row.

4. The operating method of claim 1, wherein the refreshing of the target row comprises:

checking whether a flag signal has been activated; and terminating the refreshing of the target row in response to the deactivation of the flag signal.

5. The operating method of claim 1, wherein the first delay time is greater than or equal to time that is necessary for a precharge operation based on the precharge signal to be performed.

6. The operating method of claim 1, wherein the target row precharge signal is activated after a second delay time from a time at which the target row active signal is applied.

7. The operating method of claim 6, wherein the second delay time is greater than or equal to time that is necessary for a target row active operation based on the target row active signal to be performed.

8. The operating method of claim 7, wherein the result of the counting is reset in response to the activation of the target row precharge signal.

9. The operating method of claim 1, wherein the result of the counting is reset in response to the activation of the target row precharge signal.

* * * * *